United States Patent [19]
Bang et al.

[11] Patent Number: 6,110,556
[45] Date of Patent: Aug. 29, 2000

[54] LID ASSEMBLY FOR A PROCESS CHAMBER EMPLOYING ASYMMETRIC FLOW GEOMETRIES

[75] Inventors: Won Bang, San Jose; Ellie Yieh, Millbrae; Thanh Pham, San Jose, all of Calif.

[73] Assignee: Applied Materials, Inc., Santa Clara, Calif.

[21] Appl. No.: 08/953,444

[22] Filed: Oct. 17, 1997

[51] Int. Cl.[7] .............................. B32B 3/02; C23C 16/00
[52] U.S. Cl. ..................... 428/64.1; 428/66.6; 118/715; 118/719; 118/723 I; 118/723 IR; 118/723 E; 118/723 R; 118/723 ER; 118/724; 118/725; 118/728; 118/729; 156/345
[58] Field of Search .................... 118/715, 718, 118/723 T, 723 IR, 723 E, 723 R, 723 ER, 724, 725, 720, 713; 428/66.6, 64.1; 156/345

[56] References Cited

U.S. PATENT DOCUMENTS

| | | | |
|---|---|---|---|
| 3,934,060 | 1/1976 | Burt et al. | 438/790 |
| 4,002,512 | 1/1977 | Lim | 438/546 |
| 4,565,601 | 1/1986 | Kakehi et al. | 216/59 |
| 4,567,938 | 2/1986 | Turner | 165/80.1 |
| 4,695,700 | 9/1987 | Provence et al. | 219/121 PD |
| 4,872,947 | 10/1989 | Wang et al. | 216/38 |
| 4,951,601 | 8/1990 | Maydan et al. | 118/719 |
| 5,356,476 | 10/1994 | Foster et al. | 118/725 |
| 5,510,297 | 4/1996 | Telford et al. | 438/683 |
| 5,516,367 | 5/1996 | Lei et al. | 118/725 |
| 5,545,289 | 8/1996 | Chen et al. | 438/694 |
| 5,549,802 | 8/1996 | Guo | 204/298.11 |
| 5,551,982 | 9/1996 | Anderson et al. | 118/715 |
| 5,558,717 | 9/1996 | Zhao | 118/715 |
| 6,019,848 | 2/2000 | Foukel | 118/715 |

FOREIGN PATENT DOCUMENTS

| | | |
|---|---|---|
| 0296891A3 | 6/1988 | European Pat. Off. . |
| 0780490A1 | 6/1997 | European Pat. Off. . |
| 61-79773 | 4/1986 | Japan . |

OTHER PUBLICATIONS

A.C. Adams et al., "The Deposition of Silicon Dioxide Films at Reduced Pressure," *J. Electrochem. Soc.: Solid State Science and Technology*, vol. 126, No. 6, pp. 1042–1046, (Jun. 1979).

D.B. Lee, "Diffusion Into Silicon From an Arsenic–Doped Oxide," *Solid State Electronics*, Pergamon Press, Printed in Great Britain, vol. 10, pp. 623–624, (1967).

S.M. Sze, "Dielectric and Polysilicon Film Deposition", *VLSI Technology* (McGraw–Hill Book Company), pp. 94–108 and 116, (1983).

E. Tanikawa et al., "Doped Oxide Films by Chemical Vapor Deposition in an Evacuated System," *Denki Kagaku*, vol. 41, No. 7, pp. 491–497, (1971).

R.H. Vogel et al., "Electrical Properties of 10–50 nm TEOS LPCVD Films," *Technical Report U.S. Army Research Office Contract DAAG29–14 81–K–0007*, pp. 1–29, (1984).

*Primary Examiner*—Leszek Kiliman
*Attorney, Agent, or Firm*—Townsend, Townsend & Crew

[57] ABSTRACT

A chemical vapor deposition (CVD) system of the type having an enclosure housing a process chamber and a supply of cleaning gas, features a lid having a base plate with opposed first and second major surfaces and a plurality of throughways extending therebetween to provide an asymmetric flow of cleaning gas into the chamber. Specifically, a subportion of the second major surface lies in a plane of truncation and faces the process chamber when the lid is in a closed position. The remaining portions of the second major surface are recessed, defining central and annular recesses. The annular recess has a base surface and two spaced-apart side surfaces extending from the base surface and terminating proximate to the plane of truncation. The plurality of throughways consists of primary and secondary throughways, each of which extends from an opening in the first major surface and terminates in an orifice. The orifices associated with the secondary throughways are positioned in one of the side surfaces of the annular recess. The orifices associated with the primary throughways lie in the plane that extends orthogonally to the spaced-apart side surfaces.

20 Claims, 8 Drawing Sheets

LID ASSEMBLY FOR A PROCESS CHAMBER EMPLOYING ASYMMETRIC FLOW GEOMETRIES

CROSS-REFERENCE TO RELATED APPLICATIONS

This application is related to commonly assigned patent application Ser. No. 08/749,925 now U.S. Pat. No. 6,019,848 (filed Nov. 13, 1996) entitled "LID ASSEMBLY FOR HIGH TEMPERATURE PROCESSING CHAMBER," having Jonathan Frankel, Inna Shmurun, Visweswaren Sivaramakrishinan, Eugene Fukshanski listed as co-inventors; and to commonly assigned patent application Ser. No. 08/749,283 now pending (filed Nov. 13, 1996) entitled "HEATER/LIFT ASSEMBLY FOR HIGH TEMPERATURE PROCESSING CHAMBER," having Jonathan Frankel, Hari Ponnekanti, Inna Shmurun, and Visweswaren Sivaramakrishnan listed as co-inventors; and to commonly assigned patent application Ser. No. 08/746,748 now pending (filed Nov. 13, 1996) entitled "CHAMBER LINER FOR HIGH TEMPERATURE PROCESSING CHAMBER," having Jonathan Frankel and Visweswaren Sivaramakrishnan listed as co-inventors; and to commonly assigned patent application entitled "SUBSTRATE PROCESSING APPARATUS WITH BOTTOM-MOUNTED REMOTE PLASMA SYSTEM," having Gary Fong and Irwin Silvestre listed as co-inventors; and to commonly assigned patent application Ser. No. 08/749,284 now pending (filed Nov. 13, 1996) entitled "LIFT ASSEMBLY FOR HIGH TEMPERATURE PROCESSING CHAMBER," having Jonathan Frankel listed as inventor; and to commonly assigned patent application Ser. No. 08/749,286 now U.S. Pat. No. 5,879,574 (filed Nov. 13, 1996) entitled "SYSTEMS AND METHODS FOR DETECTING END OF CHAMBER CLEAN IN A THERMAL (NON-PLASMA) PROCESS," having Visweswaren Sivaramakrishnan and Gary Fong listed as co-inventors; and to commonly assigned patent application Ser. No. 08/748,883 now pending (filed Nov. 13, 1996) entitled "SYSTEMS AND METHODS FOR HIGH TEMPERATURE PROCESSING OF SEMICONDUCTOR WAFERS," having Visweswaren Sivaramakrishnan, Ellie Yieh, Jonathan Frankel, Li-Qun Xia, Gary Fong, Srinivas Nemani, Irwin Silvestre, Inna Shmurun, and Tim Levine listed as co-inventors; and to commonly assigned patent application entitled "METHODS AND APPARATUS FOR CLEANING SURFACES IN A SUBSTRATE PROCESSING SYSTEM," having Gary Fong, Li-Qun Xia, Srinivas Nemani, and Ellie Yieh listed as co-inventors; and to U.S. Pat. No. 5,935,340 entitled "METHODS AND APPARATUS FOR GETTERING FLUORINE FROM CHAMBER MATERIAL SURFACES," having Li-Qun Xia, Visweswaren Sivaramakrishnan, Srinivas Nemani, Ellie Yieh, and Gary Fong listed as co-inventors; and to U.S. Pat. No. 5,963,840 entitled "METHODS AND APPARATUS FOR DEPOSITING PREMETAL DIELECTRIC LAYER AT SUB-ATMOSPHERIC AND HIGH TEMPERATURE CONDITIONS," having Li-Qun Xia, Ellie Yieh, and Srinivas Nemani listed as co-inventors; and to commonly assigned patent application Ser. No. 08/746,631 now pending (filed Nov. 13, 1996) entitled "METHODS AND APPARATUS FOR SHALLOW TRENCH ISOLATION," having Ellie Yieh, Li-Qun Xia, and Srinivas Nemani listed as co-inventors; and to commonly assigned patent application Ser. No. 08/746,657 now U.S. Pat. No. 5,968,587 (filed Nov. 13, 1996) entitled "SYSTEMS AND METHODS FOR CONTROLLING THE TEMPERATURE OF A VAPOR DEPOSITION APPARATUS," having Jonathan Frankel listed as inventor; and to U.S. Pat. No. 5,939,831 entitled "METHODS AND APPARATUS FOR PRE-STABILIZED PLASMA GENERATION FOR MICROWAVE CLEAN APPLICATIONS," having Gary Fong, Fong Chang, and Long Nguyen listed as co-inventors; and to commonly assigned patent application Ser. No. 08/748,094 now U.S. Pat. No. 5,994,209 (filed Nov. 13, 1996) entitled "METHOD AND APPARATUS FOR FORMING ULTRA-SHALLOW DOPED REGIONS USING DOPED SILICON OXIDE FILMS," having Ellie Yieh, Li-Qun Xia, Paul Gee, and Bang Nguyen listed as co-inventors. Each of the above referenced applications is assigned to Applied Materials Inc., the assignee of the present invention, and each of the above referenced applications is hereby incorporated by reference.

BACKGROUND OF THE INVENTION

The present invention relates to semiconductor processing. Specifically, the present invention relates to a process chamber lid that facilitates cleaning of an interior of the process chamber.

During chemical vapor deposition (CVD) processing, reactive gases released inside a process chamber form layers, such as silicon oxides or nitrides, on the surface of a substrate being processed. During this process, oxide/nitride deposition occurs elsewhere in the CVD apparatus. The oxide/nitride residue has a deleterious effect on the CVD process if the CVD apparatus is not periodically cleaned. To avoid these deleterious effects, periodic cleaning procedures are undertaken to remove the oxide/nitride residue every N wafers, where N is an integer. The cleaning procedures, however, result in periodic down-time for the CVD system, thereby reducing the system throughput.

To reduce the total down-time of the CVD system, due to the aforementioned cleaning procedures, two types of cleaning techniques are employed: a gas-clean technique and a wet-clean technique. During a gas-clean technique, a cleaning gas, such as oxygen, $NF_3$, helium and/or nitrogen, is flowed into the process chamber to remove oxide residue present therein. The gas-clean technique is achieved without breaking the vacuum seal of the process chamber, the seal being formed when a lid associated with the process chamber is in a closed position. This technique minimizes the amount of down-time necessary to perform the cleaning procedure. The gas-clean technique is unable to remove a portion of the oxide residue present in the CVD system, necessitating a periodic wet-clean technique. During a wet-clean technique, the vacuum seal of the process chamber is broken by moving the chamber lid to an open position. A user physically wipes down the chamber using chemical cleaners. Thus, the wet-clean technique is substantially more time-consuming than the gas-clean technique, thereby increasing the down-time of the CVD system.

What is needed, therefore, is a CVD system that reduces the time required for cleaning.

SUMMARY OF THE INVENTION

The present invention is a CVD system of the type having an enclosure housing a process chamber and a supply of cleaning gas, attached thereto. This system features a lid having a base plate with opposed major surfaces and a plurality of throughways extending therebetween to provide an asymmetric flow of cleaning gas into the chamber. The asymmetric flow overcomes a problem with removing residue from an annular recess formed in the lid. Specifically, it was observed that residue removal from the annular recess required a substantially longer time than did residue removal from the remaining portions of the process chamber. By providing the aforementioned plurality of throughways, the time required to remove residue from the system, using a gas-clean technique, is reduced. Specifically, a subportion of the second major surface lies in a plane of truncation, with the remaining portions of the second major surface being recessed, defining the annular recess. The annular recess has a base surface and two spaced-apart side surfaces extending from the base surface, terminating proximate to the plane of truncation. The plurality of throughways consists of primary and secondary throughways, each throughway extending from an opening in the first major surface and terminating in an orifice. The orifices associated with the secondary throughways are positioned in one of the side surfaces of the annular recess. The orifices associated with the primary throughways lie in a plane parallel to, but spaced-apart from, the plane of truncation.

The supply of cleaning gas is placed in fluid communication with the lid via a conduit. The conduit includes an input aperture and a plurality of output apertures. The input aperture is coupled to the supply of cleaning gas. One of the plurality of output apertures is coupled to an opening associated with the primary throughway. The remaining plurality of output apertures is coupled to the secondary throughways. Preferably, there is one primary throughway and two or more secondary throughways. The primary throughway is centrally disposed within the lid. The annular recess is disposed radially symmetrically about the primary throughway. The openings associated with the two secondary throughways are connected to a common output aperture of the conduit. The secondary throughways extend from a common output aperture, orthogonally to each other.

DETAILED DESCRIPTION OF THE SPECIFIC EMBODIMENTS

Figure 1:
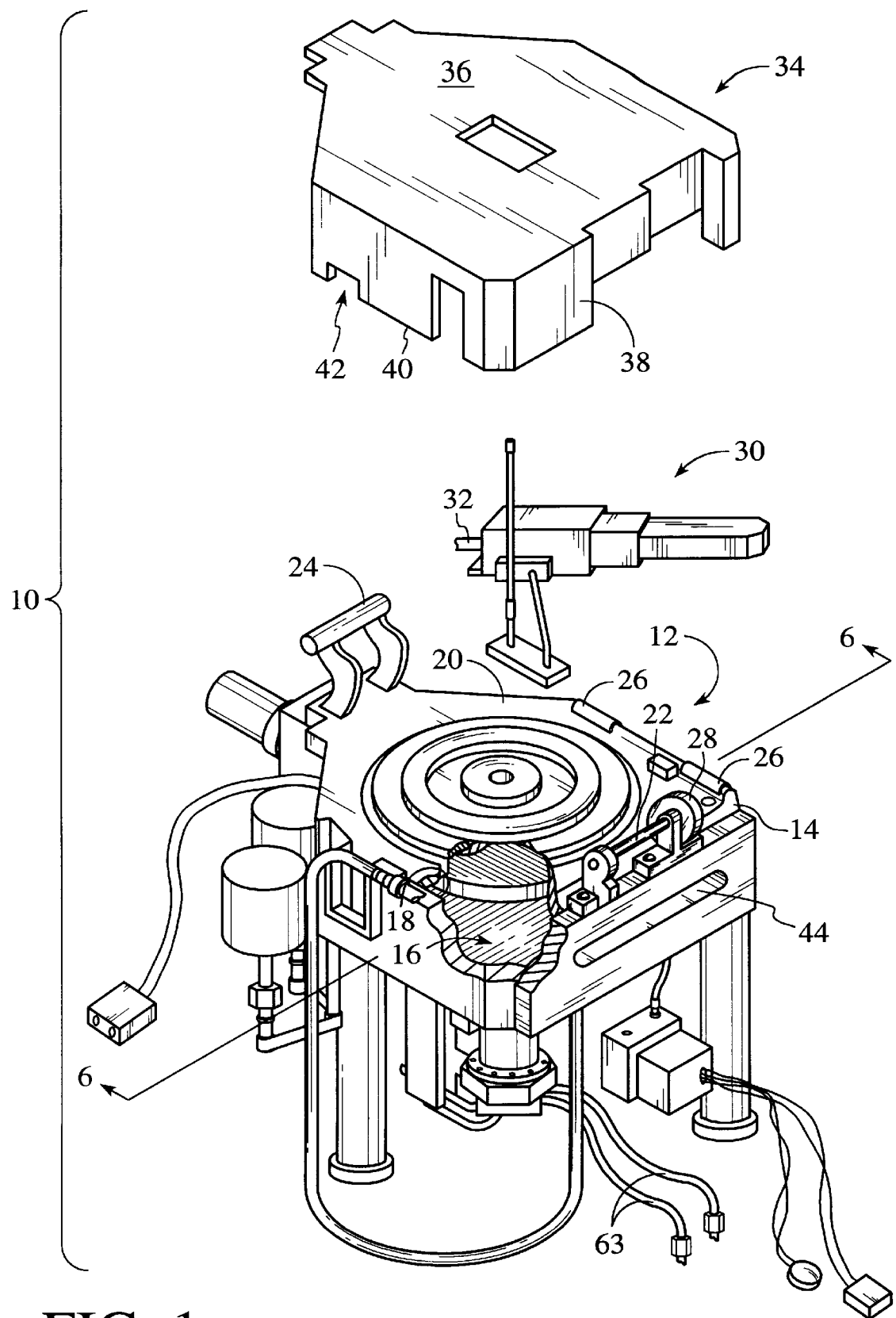
FIG. 1 is an exploded perspective view of the CVD apparatus shown in accord with the present invention.

Referring to FIG. 1 a CVD apparatus 10 includes an enclosure assembly 12 formed from a process-compatible material, such as aluminum or anodized aluminum. The enclosure assembly 12 includes a housing 14, defining a process chamber 16 with an opening 18, and a vacuum lid 20. The vacuum lid 20 is pivotally coupled to the housing 14 via a hinge 22 to selectively cover the opening 18. A handle 24 is attached to the vacuum lid 20, opposite to the hinge 22. The handle 24 facilitates moving the vacuum lid 20 between opened and closed positions. In the opened position, the opening 18 is exposed, allowing access to the process chamber 16. In the closed position, the vacuum lid 20 covers the opening 18, forming a fluid-tight seal therewith. To that end, lid clamps 26 may be employed to resiliently bias the vacuum lid 20 against the housing 14. The hinge 22, however, includes a locking ratchet mechanism 28 to prevent the vacuum lid 20 from unintentionally moving into the closed position.

A gas distribution assembly 30 is typically attached to the vacuum lid 20. The gas distribution assembly 30 delivers reactive and carrier gasses through an inlet tube 32 and into the process chamber 16, discussed more fully below. A cover 34 is in superimposition with the vacuum lid 20 and adapted to enshroud the gas distribution assembly 30. To that end, the cover 34 includes a cover portion 36 lying in a plane that extends parallel to a plane in which the vacuum lid 20 lies. A side wall 38 extends from the cover portion 36, terminating in a periphery 40. The contour of the periphery 40 typically matches the contour of the components of the apparatus 10 disposed on the vacuum lid 20. For example, the periphery 40 may include recessed portions 42 which are positioned to receive one of the lid clamps 26 when the cover 34 is seated against the vacuum lid 20. To facilitate access to the process chamber 16, without compromising the fluid-tight seal between the vacuum lid 20 and the housing 14, a slit valve opening 44 is present in the housing 14, as well as a vacuum lock door (not shown). The slit valve opening 44 allows transfer of a wafer (not shown) between the process chamber 16 and the exterior of the apparatus 10. The aforementioned transfer may be achieved by any conventional wafer transfer assembly (not shown). An example of a conventional robotic wafer transfer assembly is described in commonly assigned U.S. Pat. No. 4,951,601 to Maydan, the complete disclosure of which is incorporated herein by reference.

Figure 2:
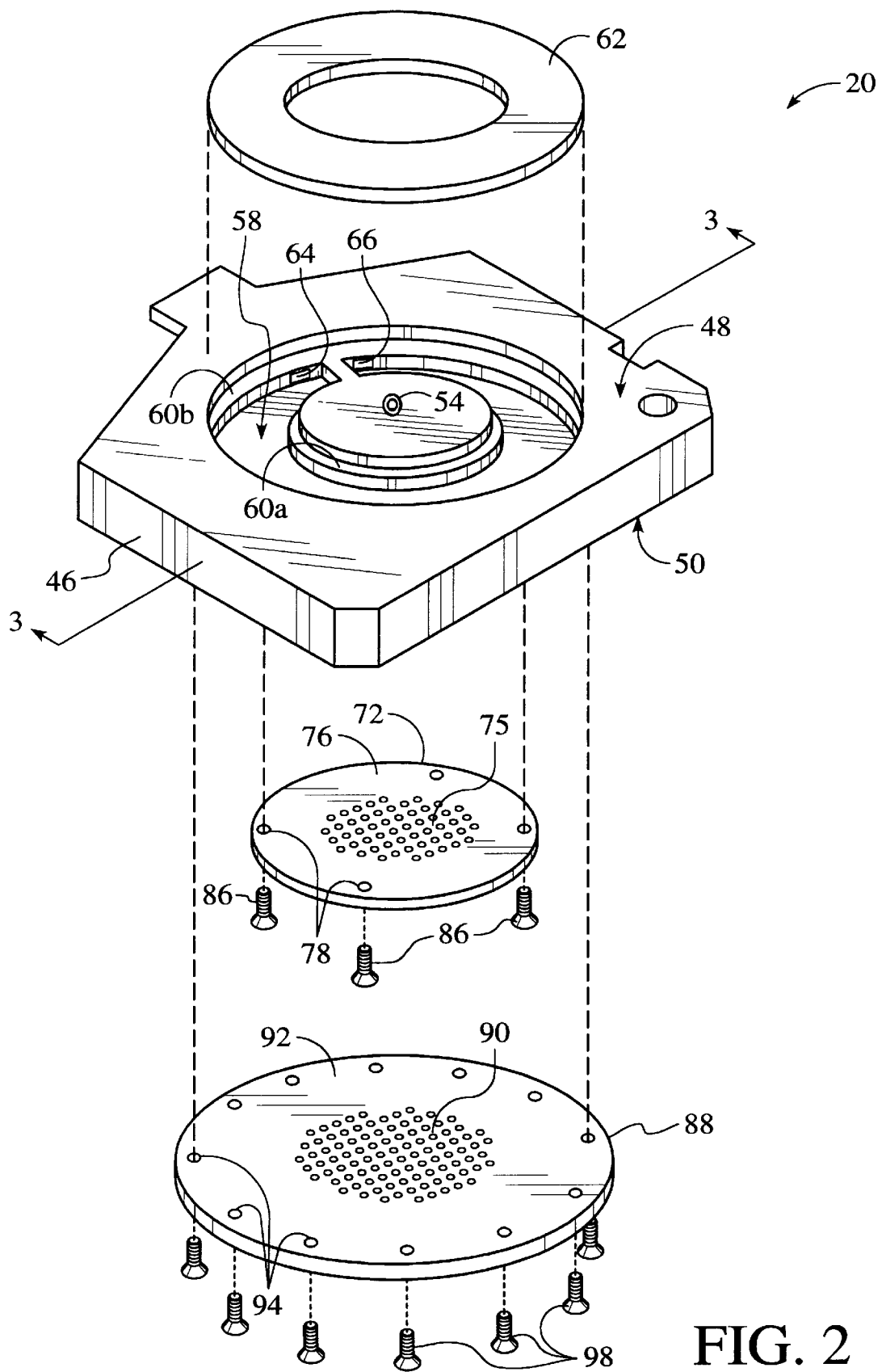
FIG. 2 is a top view of a lid assembly of the CVD apparatus shown in FIG. 1, illustrating portions of a gas distribution systems.
Figure 3:
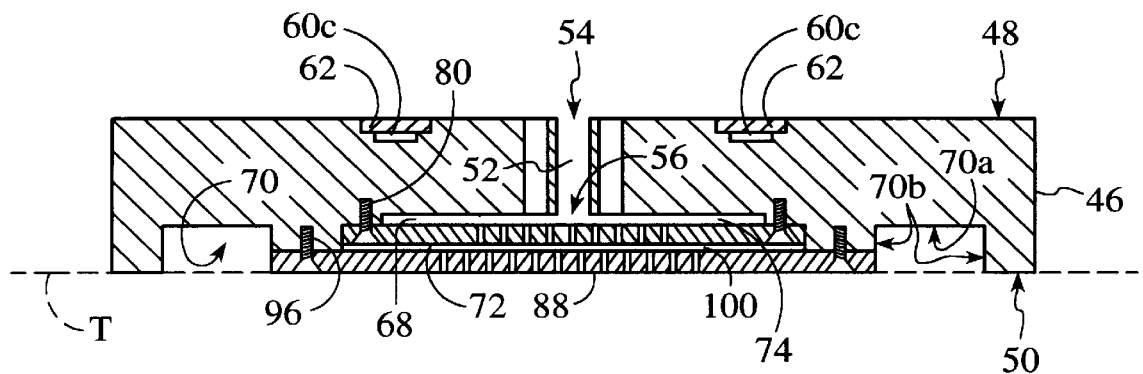
FIG. 3 is a cross-sectional view of the lid shown in FIG. 2 taken along lines 3—3.

Referring to FIGS. 2 and 3 the vacuum lid 20 includes a base plate 46, having opposed first and second major surfaces 48 and 50. A central throughway 52 is formed into the base plate 46 and extends between an opening 54, positioned in the first major surface 48 and an orifice 56 positioned in the second major surface 50, thereby placing the first and second major surfaces 48 and 50 in fluid communication. A circular recess 58 is formed into the first major surface 48, and is disposed radially symmetrically about the central throughway 52. Inner and outer annular shoulders 60a and 60b are formed on opposite sides of the circular recess 58. An annular cap 62 is provided so as to rest against the inner and outer annular shoulders 60a and 60b, defining a coolant passage 60c, shown more clearly in FIG. 3. Typically, the annular cap 62 is welded to the first major surface 48 of the base plate 46, providing a fluid-tight seal therebetween.

Referring again to FIG. 2, an inlet 64 and an outlet 66 are formed into the base plate 46 so as to place the circular recess 58 in fluid communication with a coolant system (not shown) via conduits 63, shown more clearly in FIG. 1. In this fashion, coolant may be directed through the coolant passage 60c, shown in FIG. 3, to achieve thermal control of the base plate 46. A more complete description of exemplary designs for coolant passage 60c can be found in commonly assigned, application Ser. No. 08/631,902, filed Apr. 16, 1996, now U.S. Pat. No. 5,906,683 the complete disclosure of which is incorporated herein by reference, and in commonly assigned U.S. Pat. No. 4,872,947 to Wang, the complete disclosure of which has previously been incorporated by reference.

Figure 4:
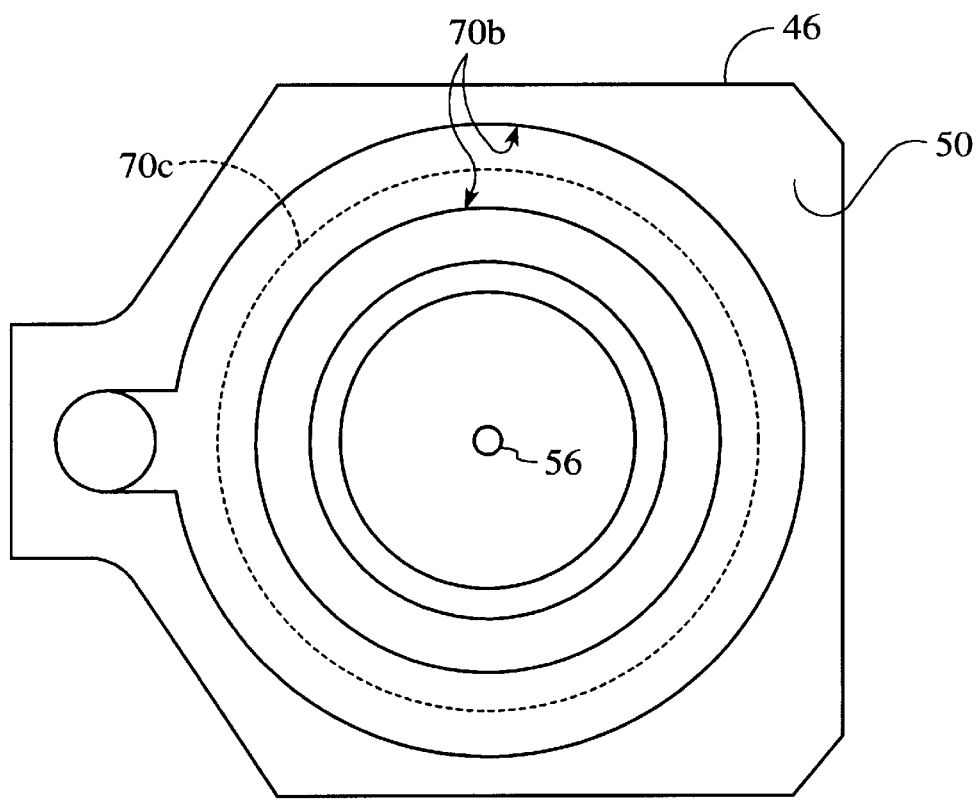
FIG. 4 is a bottom plan view of the lid assembly shown in FIG. 2.

The second major surface 50 faces the process chamber 16 when the vacuum lid 20 is placed in the closed position. As seen in FIG. 3, the second major surface 50 lies in a plane of truncation T. A central recess 68 and an annular recess 70 are formed into the second major surface 50. The orifice 56 is positioned within the central recess 68, with the annular recess 70 surrounding the central recess 68. The annular recess 70 has a base surface 70a and two spaced-apart side surfaces 70b. The base surface 70a has a center axis 70c, shown more clearly in FIG. 4. The side surfaces 70b are disposed on opposite sides of the center axis 70c, equidistant therefrom. The center axis 70c is disposed radially symmetric about the orifice 56.

Side surfaces 70b extend from the base surface 70a and terminate proximate to the plane of truncation T. The annular recess 70 facilitates exhausting deposition gases, discussed more fully below.

Referring again to FIGS. 2 and 3, although it is not necessary, typically, a gas dispersion plate 72 is formed so as to be mounted within the central recess 68. The relative geometries and dimensions of the central recess 68 and the gas dispersion plate 72 are such so that a gap 74 is present therebetween. To that end, a shoulder 76 is positioned along an outside edge of the central recess 68 against which the gas dispersion plate 72 rests, upon reaching a final seating position. Alternatively, the gas dispersion plate 72 may include a recess (not shown) to define the gap 74. The gas dispersion plate 72 includes a plurality of centrally disposed gas dispersion apertures 75, each of which typically has a diameter measuring in the range of about 0.02–0.04 mm. Surrounding the plurality of gas dispersion apertures 75 is a peripheral region 76 that includes multiple mounting orifices 78. Each of the mounting orifices aligns with an inner threaded bore 80 disposed in the second major surface 50. In this fashion, the gas dispersion plate 72 may be mounted to the base plate 46 using mounting screws 86.

Mounted adjacent to the gas dispersion plate 72 is a gas distribution plate 88, which includes a plurality of centrally disposed gas distribution apertures 90, defining an outer flange 92. The gas distribution plate 88 includes a plurality of mounting orifices 94 positioned around outer flange 92, each of which aligns with an outer threaded bore 96 in the second major surface 50. In this fashion, the gas distribution plate may be mounted to the base plate 46 using mounting screws 98. The arrangement and size of the gas distribution apertures 90 may be any desired, depending upon the application. It is preferred, however, that the gas distribution apertures 90 be disposed opposite to the plurality of gas dispersion apertures 75 and be evenly spaced to provide a uniform distribution of gases passing therethrough and to reduce the formation of deposits which may flake off during and after processing and drop onto a wafer (not shown). Each of the gas distribution apertures 90 typically has a diameter measuring between 5–100 mils and is preferably in the range of about 10–50 mils. In an exemplary embodiment, the plurality of apertures 90 is arranged as concentric rings, with the distances between adjacent rings being approximately equal. The hole-to-hole spacing within each ring is approximately equal. A more complete description of a suitable arrangement for the gas distribution holes is described in commonly assigned U.S. Pat. No. 4,872,947 to Wang, the complete disclosure of which has previously been incorporated by reference.

The relative geometries and dimensions of the base plate 46, the gas dispersion plate 72 and the gas distribution plate 88 are such that a gap 100 is present between the plurality of gas distribution apertures 90 and the plurality of gas dispersion orifices 75 when placed in the final seating position. As shown in FIG. 3, the thickness of the gas dispersion plate 72 is less than the depth of the central recess 68. In this fashion, upon seating the gas distribution plate 88 against the second major surface 50, the chamber 102 is formed between the gas dispersion plate 72 and the gas distribution plate 88. The gas dispersion plate 72 and the gas distribution plate 88 may be formed from any process-compatible material that is capable of withstanding high temperature processes, e.g., ceramic materials, such as aluminum oxide or aluminum nitride (AlN), and metal, such as aluminum or anodized aluminum, which minimizes deposition of residue thereon. The mounting screws 86 and 98 comprise a process-compatible material, such an nickel, Hasteloy™, Haynes™ or the like.

Figure 5:
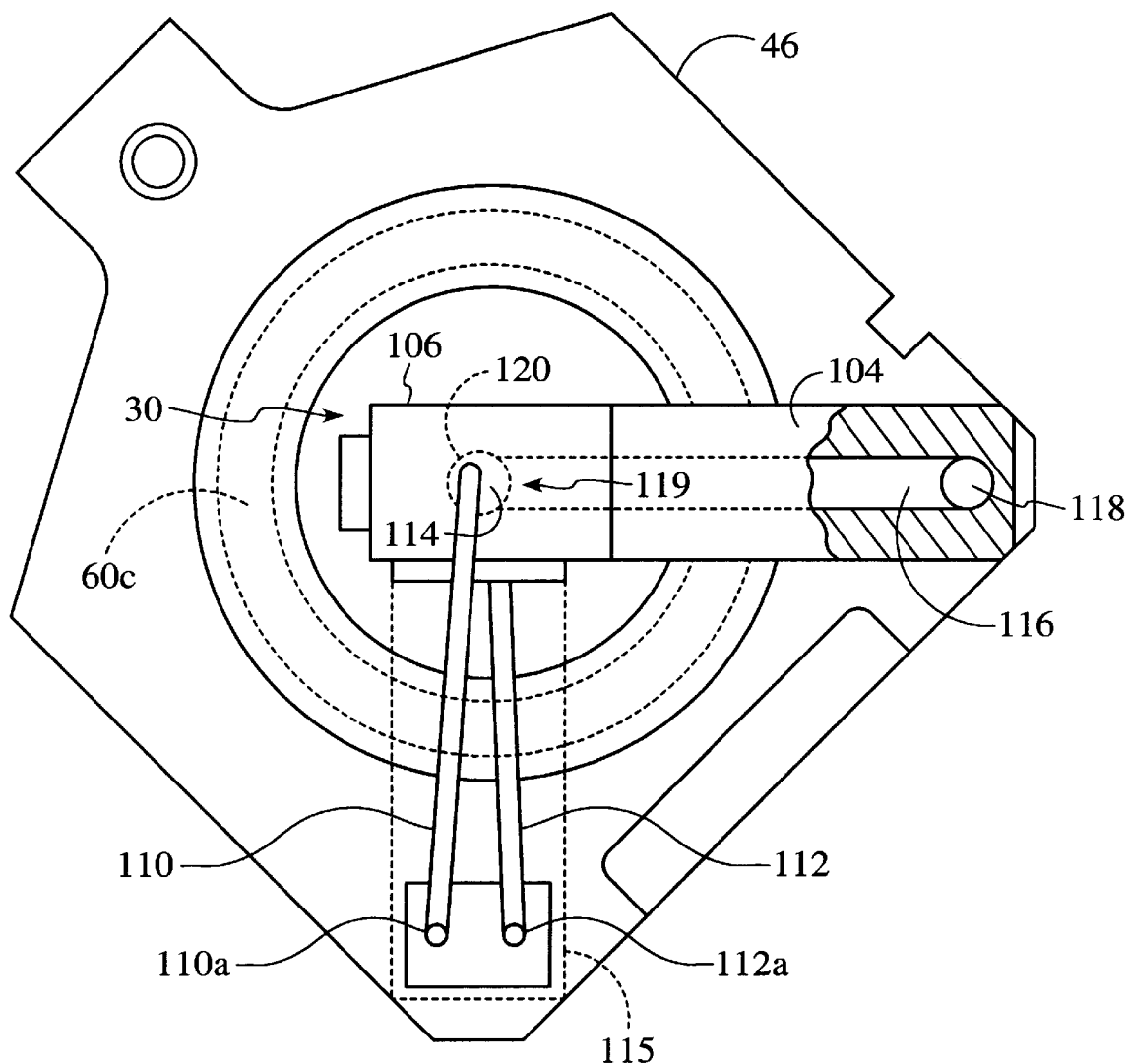
FIG. 5 is a top partial cut away view of the lid assembly shown in FIG. 1, having a gas distribution assembly attached.

Referring to FIG. 5, the gas distribution assembly 30 includes a coolant manifold (not shown), a clean gas manifold 104, a gas mixing box 106, and a plurality of gas passages shown as 110 and 112. The coolant manifold, which may be fastened to the top or side surface of base plate 46 receives coolant fluid, such as water or a glycol\water mixture, from the heat exchanger. The coolant is distributed from the coolant manifold through the coolant passage 60c. The mixing box 106 includes a mixing chamber 114. A conduit 116 extends from an input opening 118 in the clean gas manifold 104 and terminates in an output opening 119 positioned in the mixing chamber 114. The gas mixing chamber 114 includes an outlet 120 that is coupled to the opening 54 in the base plate 46, shown in FIG. 3. Referring again to FIG. 5, gas passages 110 and 112 extend from input apertures 110a and 112a, respectively, and terminate in output apertures (not shown) disposed in the mixing chamber 114. In this fashion, the gas passages 110 and 112 are in fluid communication with the mixing chamber 114. Gas passages 110 and 112 are typically housed within a gas feed-through box, shown by dashed lines 115, to prevent breakdown of gases traveling therethrough upon application of high voltage RF power during processing. A description of an exemplary gas feed-through box can be found in U.S. Pat. No. 4,872,947 to Wang, the complete disclosure of which is incorporated herein by reference.

Figure 6:
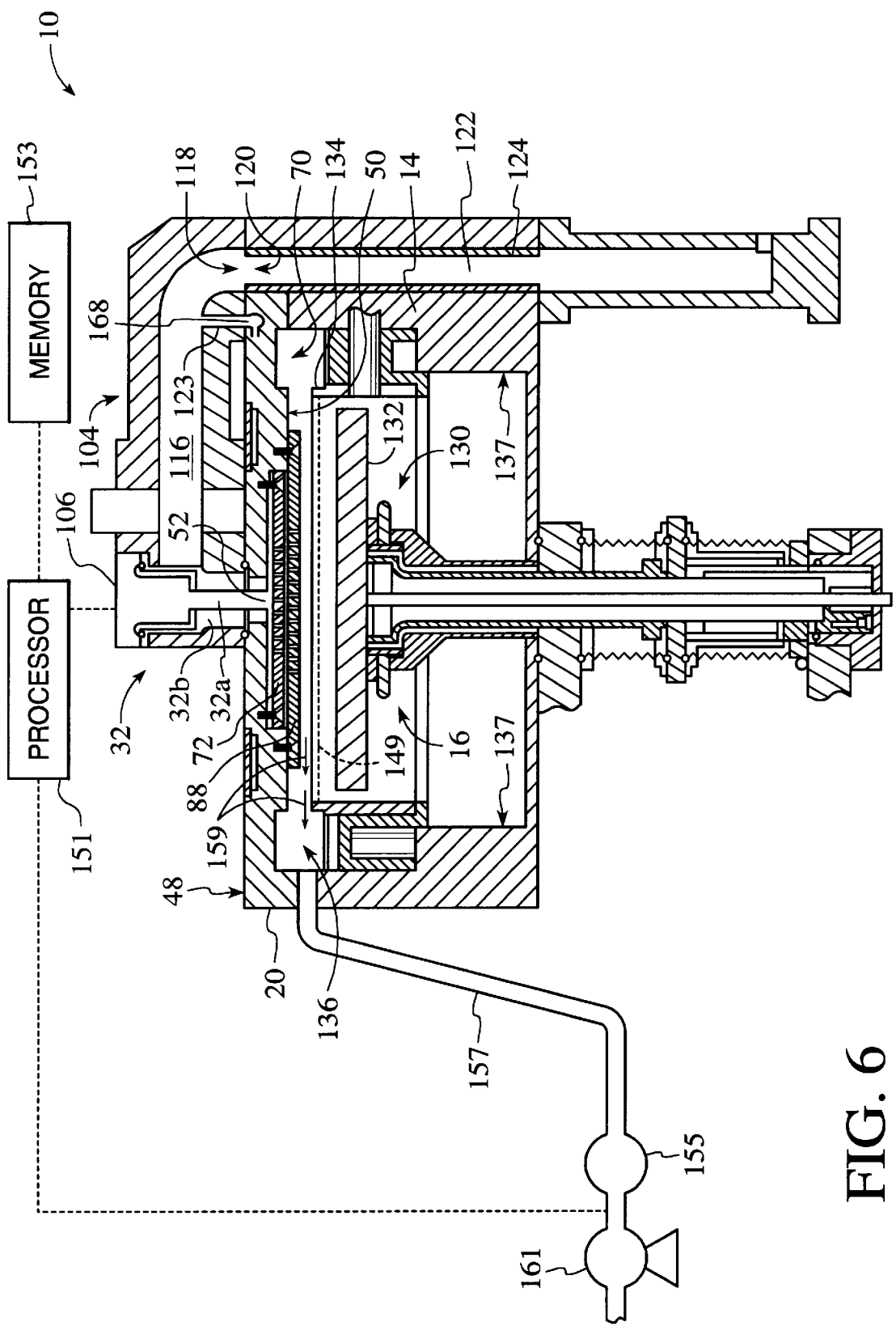
FIG. 6 is an enlarged cross-sectional view of the CVD apparatus shown in FIG. 1 taken along lines 6—6.

Referring to FIG. 6, the gas distribution assembly is attached to the first major surface 48 by bolting the clean gas manifold 104 and the gas mixing box 106 thereto. The inlet tube 32 preferably includes an inner passage 32a for delivering gases into process chamber 16, and an outer, annular passage 32b in fluid communication with the mixing chamber 114, shown in FIG. 5, for directing cleaning gases into the process chamber. Referring again to FIG. 6, the conduit 116 forms to the contour of the vacuum lid 20-housing 14 interface with the input opening 118 coupling to an outlet 120 of a flow conduit 122 integrally formed with the housing 14. A liner 124 is disposed in the conduit 116 to reduce corrosion and etching from the clean gas radicals passing therethrough. Attached to the flow conduit 122, opposite to the outlet 120, is a remote microwave plasma system 127, shown more clearly in FIG. 7.

Referring again to FIG. 6, disposed within the process chamber 16 is a heater/lift assembly 130 coupled to a wafer support pedestal 132, and a chamber liner 134. The pedestal 132 is positioned between the heater/lift assembly 130 and the vacuum lid 20, when the vacuum lid 20 is in the closed position. The heater lift assembly 130 is adapted to be controllably moved so as to vary the distance between the support pedestal 132 and the vacuum lid 20. Information concerning the position of the support pedestal 132 within the process chamber 16 is provided by a sensor (not shown). The support pedestal 132 also includes resistively-heated components. The support pedestal 132 may be formed from any process-compatible material, including aluminum nitride and aluminum oxide ($Al_2O_3$ or alumina). The chamber liner 134 surrounds the support pedestal 132 and defines a lower portion of an annular flow channel 136, with the upper portion of the annular flow channel 136 being defined by the annular recess 70, when the vacuum lid 20 is in the closed position. The chamber liner 134 typically comprises a ceramic material, such as alumina or aluminum nitride, which serves to lower the temperature gradient between the support pedestal 132 and the walls 137 of the process chamber 16.

Figure 7:
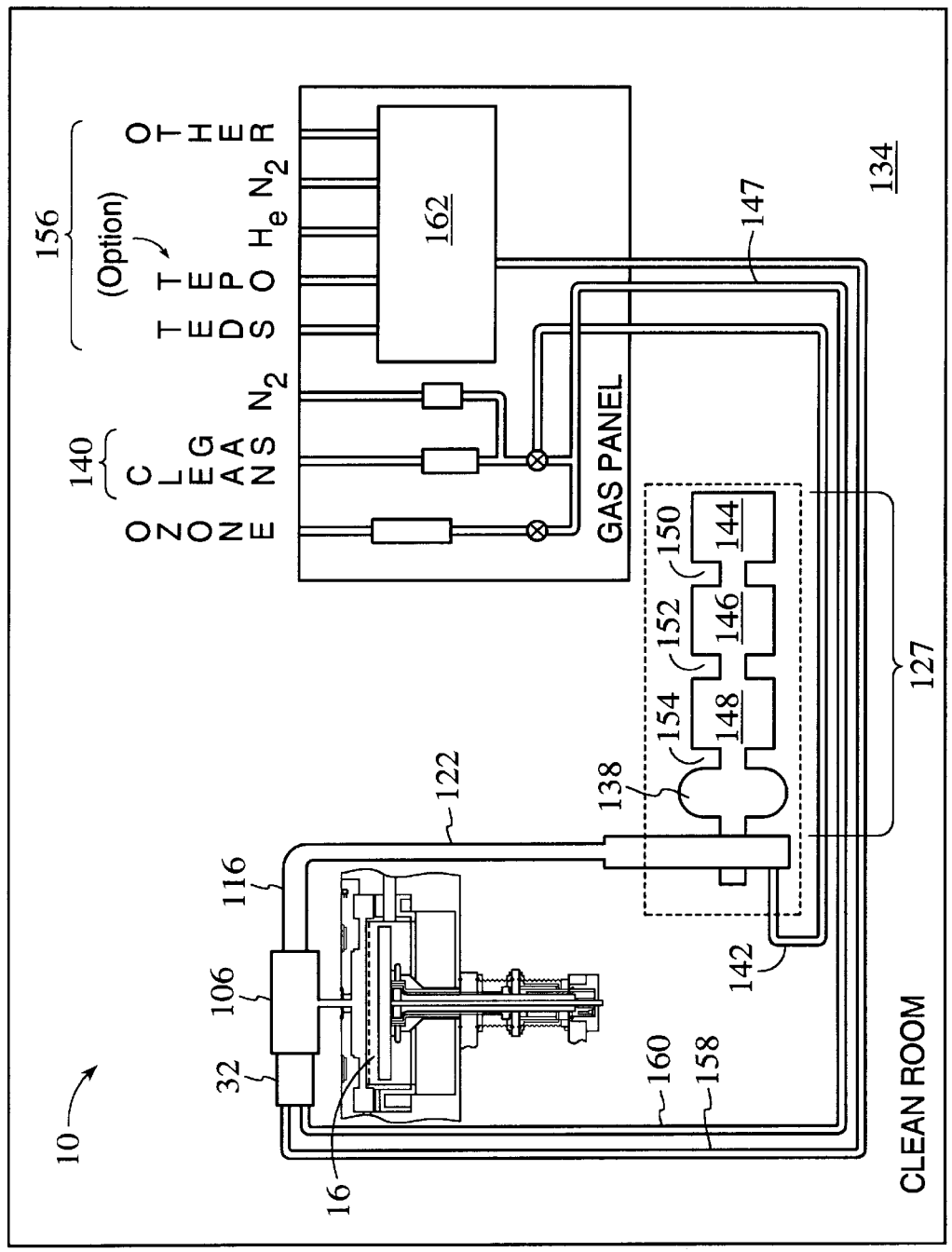
FIG. 7 is a plan view of the CVD apparatus, shown in FIG. 1, in relation to a gas supply panel located in a clean room.

Referring to FIG. 7, the remote microwave plasma system 127 includes a plasma applicator 138 in fluid communication with a supply 140 of gas via a conduit 142 and in fluid communication with the process chamber 16 via conduit 116 and flow conduit 122. A microwave generator, such as a magnetron 144, is in electrical communication with the plasma applicator 138 via an isolator 146 and an autotuner 148. Specifically, a first waveguide 150 is coupled between the magnetron 144 and the isolator 146, a second waveguide 152 is coupled between the autotuner 148 and the isolator 146; and a third waveguide 154 is coupled between the autotuner 148 and the applicator 138. The microwave energy generated by the magnetron 144 travels toward the applicator 138 by traversing waveguides 150, 152 and 154. The autotuner 148 reduces the amount of microwave energy reflected into the magnetron 144. The autotuner 148 minimizes the microwave energy reflected by the applicator 138 back into the remaining components of the remote microwave plasma system 127. Coupled to the inlet tube 32, is a supply of reactive gases such as ozone, TEOS, TEPO, helium, or the like, shown generally as 156, via gas passages 158 and 160. A mixing volume 162 may be placed in fluid communication with one or more of the gas passages to allow mixing various gases before entering the inlet tube 32. Nonetheless, mixing may occur within the mixing box 106 prior to gases entering the process chamber 16.

Referring to both FIGS. 6 and 7, a processor 151 is in electrical communication with the apparatus 10 to regulate the operations of the apparatus. Functioning as controller, the processor 151 executes system control software, which is a computer program stored in a memory 153, electronically coupled to processor 151. Any type of memory device may be employed, such as a hard disk drive, a floppy disk drive, a card rack or a combination thereof. The processor 151 operates under the control of the system control software, which includes sets of instructions that dictate the timing, mixture of gases, chamber pressure, chamber temperature, microwave power levels, susceptor position, and other parameters of a particular process. Other computer programs such as those stored on other memory including, for example, a floppy disk or other computer program product inserted in a disk drive or other appropriate drive, may also be used to operate processor 151.

During a deposition procedure, the vacuum lid 20 is placed in the closed position. The heater/lift assembly 130 places the support pedestal 132 in a processing position 149, disposed proximate to the vacuum lid 20. When placed in the processing position 149 the support pedestal 132 is surrounded by the chamber liner 134 and the annular flow channel 136. In this fashion, the support pedestal 132 is located proximate to the gas distribution plate 88. Reactive and carrier gases are supplied through inlet tube 32 into the gas mixing box 106. The gas mixing box 106 causes the aforementioned gases to intermingle, forming a process gas. The process gas then passes through the gas dispersion plate 72, the gas distribution plate 88 and into the process chamber 16 where it is vented to toward the pedestal 132, where a wafer (not shown) would be positioned. In this manner, the process gas may be uniformly radially distributed across the pedestal 132, in a laminar flow.

The deposition process performed in the apparatus 10 is a thermal, sub-atmospheric pressure process, often referred to as sub-atmospheric CVD (SACVD). The reactive gases flowed into the process chamber 16 result in heat-induced chemical reactions (homogeneous or heterogeneous) that produce a desired film on a wafer (not shown) placed on the support pedestal 132. The heat is typically distributed by the resistively-heated pedestal 132 which is capable of reaching temperatures as high as about 400–800° C. Such heat distribution provides uniform, rapid thermal heating of the wafer for effecting in situ deposition, reflow and/or drive-in, cleaning, and/or seasoning/gettering steps in a multiple-step process in the process chamber 16. Alternatively, a controlled plasma may be formed adjacent to the wafer by RF energy applied to gas distribution plate 88 from an RF power supply (not shown). Additionally, a lower RF electrode, may be employed so that the RF power may be supplied in either single-frequency RF power to plate gas distribution plate 88, or mixed-frequency RF power to gas distribution plate 88 and the aforementioned lower RF electrode. Providing dual-frequency RF power to two separate electrodes facilitates decomposition of reactive species introduced into the process chamber 16. In a plasma process, some of the components of the vapor deposition apparatus 10 would have to be modified to accommodate the RF energy, as is well known in the art.

Referring again to FIG. 7, during a gas-clean technique, the reactive gas from supply 140 is flowed, under vacuum created by the process chambers 16's pumping and exhaust system (not shown), into the plasma applicator 138 where microwave energy transmitted from the magnetron 144 forms standing waves. The standing waves in applicator 138 ignite and maintain a plasma from the reactive gas, and a flow of reactive radicals, also under vacuum, is discharged from applicator 138, through flow conduit 122 and toward the process chamber 16, via conduit 116 to etch the wafer or the inner chamber walls and the other components of apparatus 10. Additionally, the microwave plasma system 127 may be employed to remove, i.e., etch, native oxides or residues from the surface of a wafer (not shown) present on the pedestal 132.

Referring again to both FIGS. 6 and 7, the pump 155 provides vacuum pressure to draw both the process and purge gases, as well as residues, out of the process chamber 16 and through annular flow channel 136, where the gases are discharged from apparatus 10 along an exhaust line 157. Specifically, a purging gas may be flowed into the process chamber 16 from an inlet port or tube (not shown) through the bottom wall of the housing 14. The purging gas would then flow upwardly past pedestal 132 and into the annular flow channel 136. The gas is then exhausted, as indicated by arrows 159, into the annular flow channel 136 and through the exhaust line 157. Exhaust gases and residues are preferably released from the annular flow channel 136 through the exhaust line 157 at a rate regulated by a throttle valve system 161, under control of the processor 151. In this fashion, the deposition and clean gases are exhausted radially outward over the pedestal 132, shown by the arrows 152.

A problem encountered during the gas-clean technique concerned the removal of oxide/nitride residue from the annular recess 70. Specifically, it was observed that a substantially longer period of time is required to remove residue from the annular recess 70 as compared to the removal of residue from the remaining portions of the second major surface 50 and the remaining components in the process chamber 16. To overcome the aforementioned problem, secondary throughways 164 and 166, shown more clearly in FIG. 8, were formed in the base plate 46 so that gasses emerging therefrom would be directed into the annular recess 70. Although any number of secondary throughways may be included, it is preferred to have at least two secondary throughways. Similar to the central throughway 52, each of the secondary throughways 164 and 166 extends from an orifice 164a and 166a, respectively, formed into the second major surface 50 of the base plate 46 and terminating in an opening in the first major surface 48. Each of the secondary throughways 164 and 166 may be associated with a separate opening in the first major surface 48. It is preferred, however, that the secondary throughways 164 and 166 terminate in a common opening 168 formed in the first major surface 48, which is in fluid communication with conduit 116, via flow channel 123 shown more clearly in FIG. 6.

Referring again to FIG. 8, the secondary throughways 164 and 166 may extend along any path in the base plate 46 between common opening 168 and the orifices 164a and 166a. It is preferred, however, that the throughways 164 and 166 extend so that the orifices 164a and 164a are spaced-apart from the orifice 56. To that end, each of the orifices 164a and 166a are positioned in one of the side surfaces 70b, preferably in a common side surface which is distally positioned from the central throughway 52. It is preferred that a centerline 164b and 166b of each of the orifices 164a and 166a extends tangentially to the center axis 70c. In this fashion, each of the orifices 164a and 166a lies in a plane that extends orthogonally to a plane in which orifice 56 lies.

Figure 8:
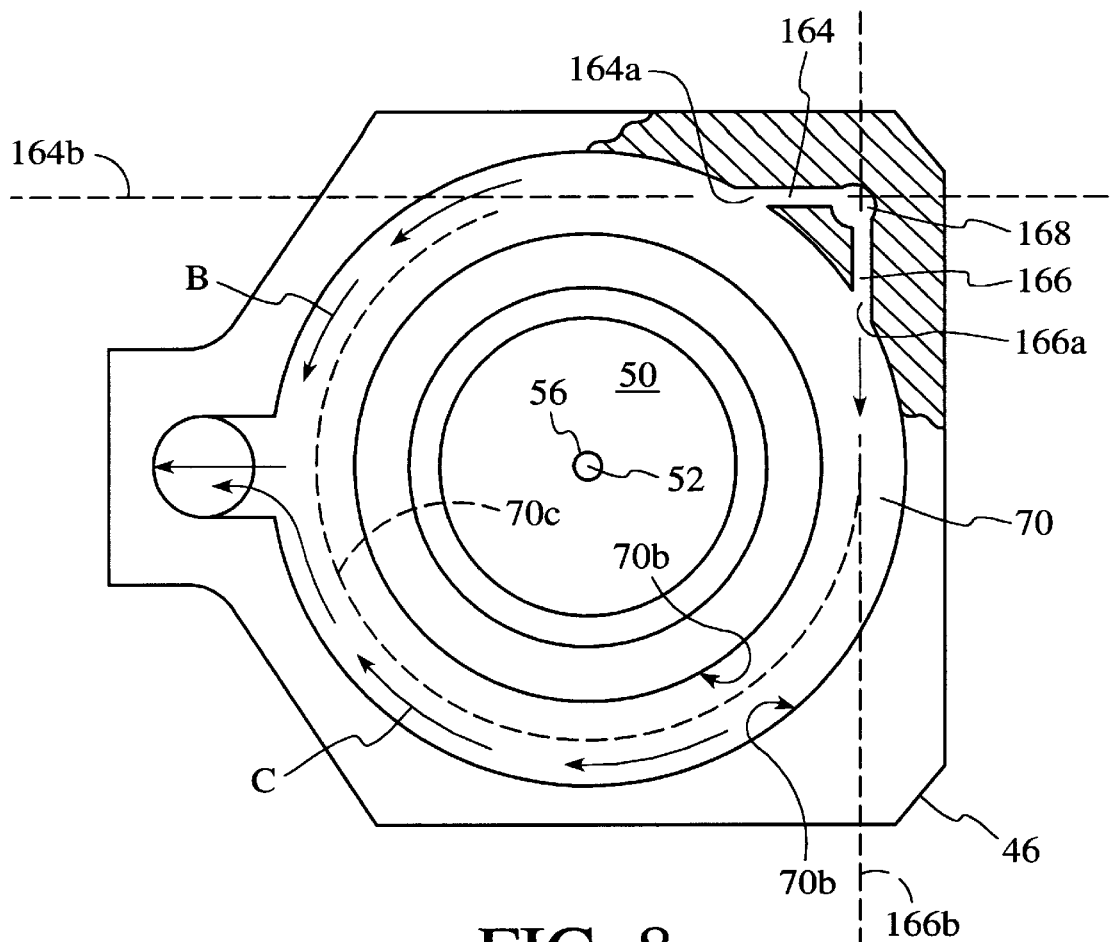
FIG. 8 is a bottom view, shown in partial cross-section, of the lid assembly shown in FIG. 6.
Figure 9:
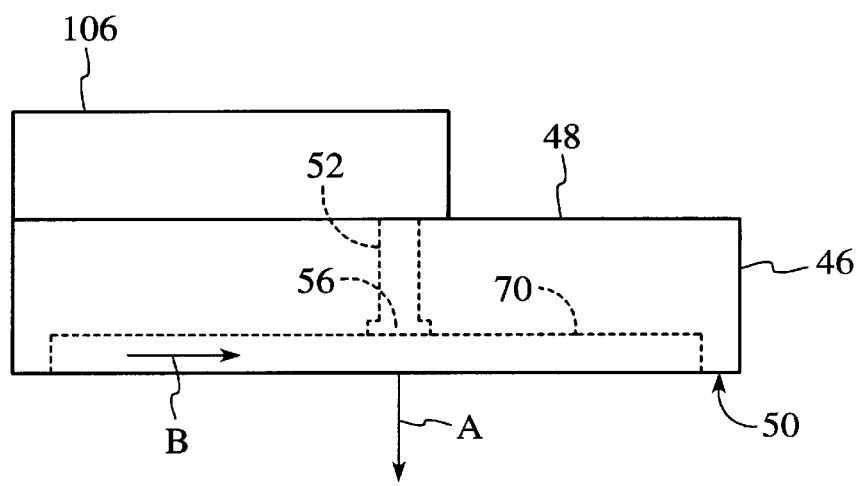
FIG. 9 is a side view of the lid assembly shown in FIG. 2.

Referring to both FIGS. 6 and 8, during the gas-clean technique described above, the clean gas entering the clean gas manifold 104 bifurcates into two gas flows, one of which enters the common opening 168, with the remaining gas flow traveling along conduit 116 to pass through central throughway 52. The flow of gas entering the common opening 168 bifurcates again, with one of the gas flows traveling through secondary throughway 164 and the remaining flow traveling through secondary throughway 166. The flow of gases traveling through secondary throughways 164 and 166 exits from orifices 164a and 166a, extending tangentially to the center axis 70c and orthogonally to the gas stream exiting the orifice 56. In this fashion, an asymmetric flow of clean gas is formed in the process chamber 16. As shown in FIGS. 8 and 9, a gas stream exiting from orifice 56 travels along direction A. Gas streams exiting from orifices 164a and 166a travel along directions B and C, respectively. This results in an asymmetric flow of the gas within the chamber, which creates turbulent flow therein. It is believed that the turbulent flow, produced by the asymmetric flow, along with directing a flow of clean gas directly into the annular recess 70, reduces the time necessitated to clean the process chamber 16 by as much as thirty seconds.

Subsequent to purging the aforementioned clean gas from the process chamber 16, a second clean gas may be introduced into the process chamber 16 to remove any cleaning residue present therein, resulting from the reaction between the prior clean gas and the interior surfaces of the process chamber 16. Removing or gettering the cleaning residue from the chamber provides a number of advantages. For example, fluorine radicals may be delivered into the process chamber 16 to remove residue such as silicon oxide by forming a silicon-fluoride gas product which is pumped away from the chamber. After the fluorine-based chamber cleaning procedure, any adsorbed fluorine on the surface of the chamber walls 137 which might otherwise interact with, or be incorporated into, the deposited film on the next wafer to be processed is gettered. In an alternative embodiment, the gettering may be performed by seasoning the process chamber 16 using microwave-generated atomic oxygen and a silicon source to deposit a thin film of oxide onto the chamber to trap any adsorbed fluorine and prevent contamination of the subsequently deposited films.

Figure 10:
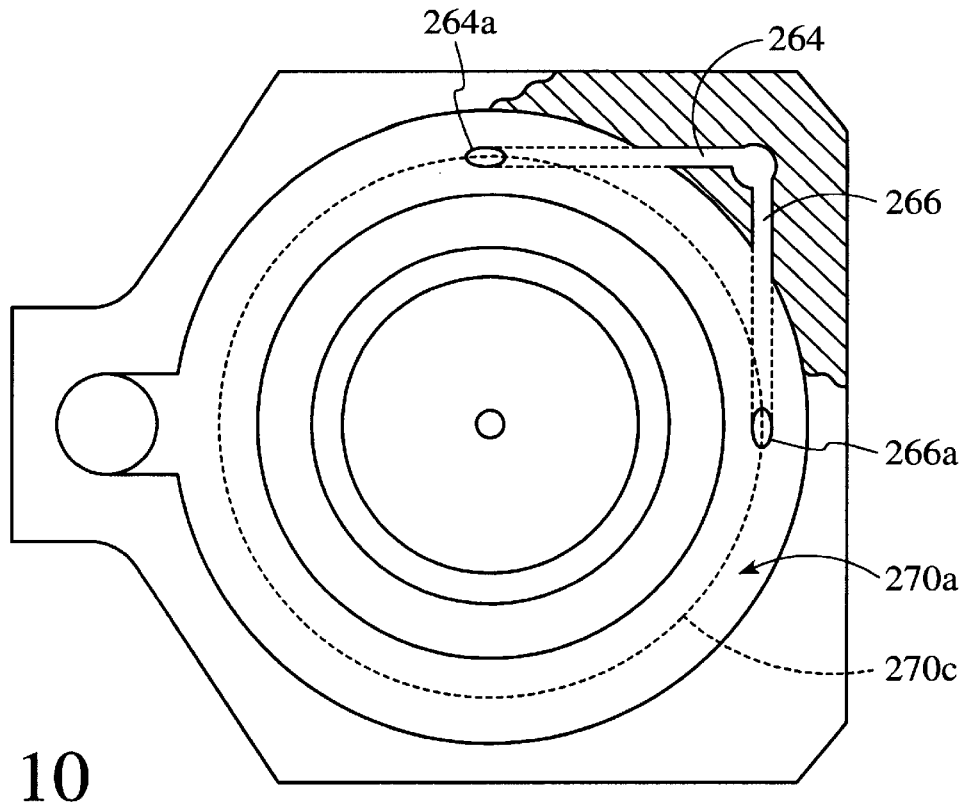
FIG. 10 is a bottom-view, shown in partial cross-section, of the lid assembly, shown in FIG. 8 in accord with an alternate embodiment.

Referring to FIG. 10, in an alternate embodiment, the secondary throughways 264 and 266 may be formed in the base plate 246 so that the orifices 264a and 266a are formed in the base surface 270a. In this fashion, each orifice 264a and 266a would be provided with an elliptical cross-section. Each of the orifices 264a and 266a may lie on the center axis 270c so that the major axis (not shown) of the elliptical cross-section is superimposed therewith.

Figure 11:
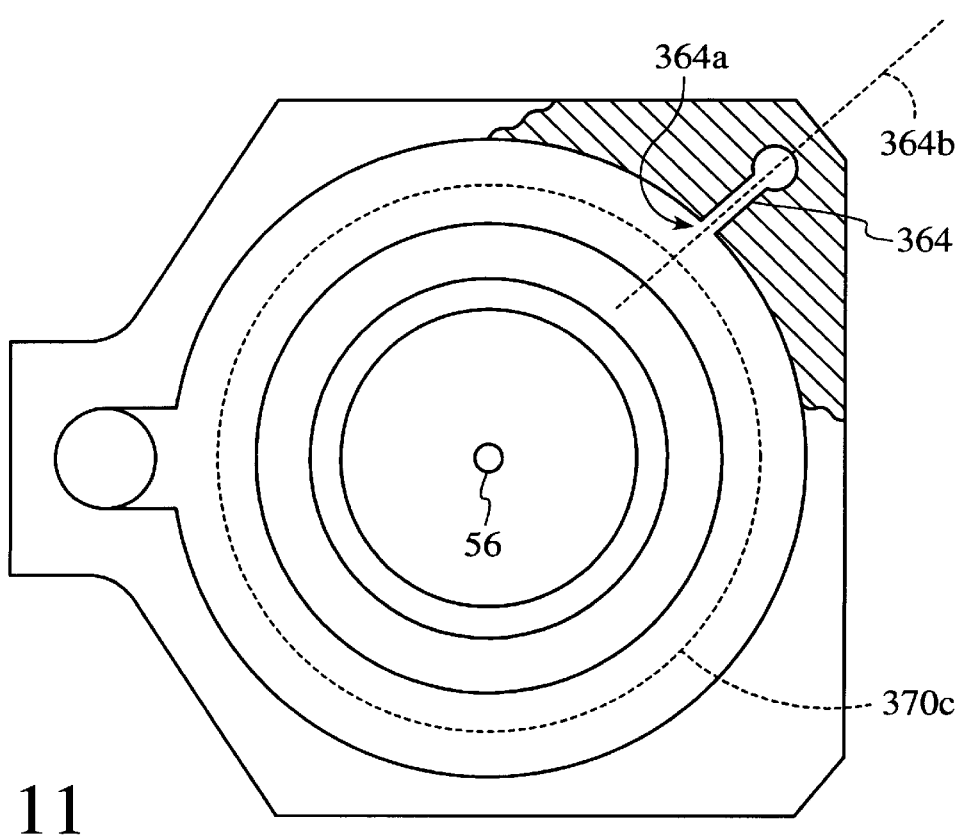
FIG. 11 is a bottom view, in partial cross-section, of the lid assembly shown in FIG. 8, in accord with a second alternate embodiment.

Finally, it is possible that the centerline 364b of the secondary throughway 364 extend along a direction normal to the center axis 370c, shown more clearly in FIG. 11. In this fashion, the orifice 364a would have a circular cross-section, and a gas stream exiting therefrom would extend transversely to both the center axis 370c and a gas stream exiting from the orifice 56. The scope of the invention should, therefore, be determined not with reference to the above description, but instead should be determined with reference to the appended claims along with their full scope of equivalents.

What is claimed is:

1. A lid assembly for a vapor deposition apparatus of the type having an enclosure housing a process chamber, said lid assembly comprising:

a base plate having a body including first and second opposed major surfaces disposed on opposite sides of the body, said first major surface having a plurality of openings disposed therein and said second major surface orientated to face said process chamber upon said lid being placed in a closed position, said second major surface having a plurality of orifices disposed therein, each of which is fluidly coupled with one of said plurality of openings in said first major surface to permit fluid communication therebetween, each of said orifices having a centerline and being oriented with the centerline lying on a plane, with a subset of said plurality of orifices having centerlines lying in a first plane, and the remaining orifices having centerlines lying in a second plane, extending transversely to said first plane.

2. The lid assembly as recited in claim 1 wherein said first plane extends parallel to said second major surface.

3. The lid assembly as recited in claim 1 wherein said second major surface includes an annular recess defining an annular base surface recessed from said second major surface and having an inner edge and an outer edge, and two spaced-apart side surfaces extending transversely from said inner edge and said outer edge of said annular base surface, respectively, to said second major surface, defining an annular opening therebetween, with one of said plurality of orifices of said subset being disposed in one of said side surfaces.

4. The lid assembly as recited in claim 1 wherein one of said plurality of orifices of said subset has an elliptical cross-section.

5. The lid assembly as recited in claim 1 wherein one of said plurality of orifices of said subset has a circular cross-section.

6. The lid assembly as recited in claim 1 wherein said base plate includes a plurality of throughways extending between the openings in the first major surface and the orifices of the second major surface, wherein a subgroup of said throughways associated with orifices of said subset of orifices lying in said first plane extend from a common opening in the first major surface.

7. The lid assembly as recited in claim 1 wherein said base plate includes a plurality of throughways extending between the openings in the first major surface and the orifices of the second major surface, wherein a subgroup of said throughways associated with orifices of said subset extend from a common opening in the first major surface, with each throughway of said subgroup extending orthogonally to the remaining throughways of said subgroup.

8. The lid assembly as recited in claim 1 further including a supply of gas and a conduit having an input aperture and a plurality of output apertures, with said input aperture being coupled to said supply of gas, a subset of said plurality of output apertures being positioned proximate to said input aperture of said conduit and being coupled to an opening in said first major surface which are associated with said subset of orifices, with the remaining output apertures being distally positioned from said input aperture and coupled to openings in said first surface which are associated with said remaining orifices.

9. The lid assembly as recited in claim 3 wherein said annular base surface has a center axis disposed between the two spaced-apart side surfaces and extending radially symmetrically about one of said remaining orifices, with said one of said plurality of orifices of said subset located within said side surface to allow a fluid stream, egressing therefrom, to extend tangentially to said center axis.

10. A lid assembly for a vapor deposition apparatus of the type having an enclosure housing a process chamber, said lid assembly comprising:

a base plate having a body including first and second opposed major surfaces disposed on opposite sides of the body, with primary and secondary throughways extending therebetween, a subportion of said second major surface lying in a plane of truncation with the remaining portions of said second major surface being recessed from said plane of truncation to define central and annular recesses, said annular recess having an annular, recessed base surface including an inner edge and an outer edge, said annular recess having two spaced-apart side surfaces extending respectively from said inner edge and said outer edge of said annular base surface and terminating proximate to said plane of truncation, with each of said primary and secondary throughways extending from an opening in said first major surface and terminating in an orifice in said second major surface, with orifices associated with secondary throughways being positioned in one of said side surfaces and orifices associated with said primary throughways being disposed in said central recess.

11. The lid assembly as recited in claim 10 wherein said annular base surface has a center axis disposed between the two spaced-apart side surfaces and extending radially symmetrically about one of said orifices associated with said primary throughways, with said orifices associated with said secondary throughways located within said side surface to allow a fluid stream egressing therefrom to extend tangential to said center axis.

12. The lid assembly as recited in claim 10 wherein said orifices associated with said secondary throughways have an elliptical cross-section.

13. The lid assembly as recited in claim 10 wherein said orifices associated with said secondary throughways have a circular cross-section.

14. The lid assembly as recited in claim 10 wherein said secondary throughways consist of two throughways one of which extends along a first direction, with the primary throughways extending along a second direction orthogonal to said first direction.

15. The lid assembly as recited in claim 14 further including a supply of gas and a conduit extending along a third direction and having an input aperture and a plurality of output apertures, with said input aperture being coupled to said supply of gas, one of said plurality of output apertures being positioned proximate to said input aperture and coupled to said two throughways, with said first and second direction being oblique with respect to said third direction.

16. A lid assembly for a vapor deposition apparatus of the type having an enclosure housing a process chamber and a supply of gas attached thereto, said lid assembly comprising:

a base plate having a body including opposed major surfaces disposed on opposite sides of the body, a primary throughway and two secondary throughways, a conduit having an input aperture and a plurality of output apertures, with each of said primary and secondary throughways placing said opposed major surfaces in fluid communication, said input aperture being coupled to said supply of gas, one of said plurality of output apertures being coupled to said primary throughway, with the remaining plurality of output apertures being coupled to said secondary throughways, with said primary and secondary throughways being arranged to provide two fluid streams of said gas egressing from said second major surface in two orthogonal directions.

17. The lid assembly of claim 16 wherein said primary and secondary throughways are arranged to provide a plurality of fluid streams of said gas egressing from said second major surface in three orthogonal directions.

18. The lid assembly of claim 16 wherein said primary and secondary throughways are arranged to provide a plurality of fluid streams of said gas egressing from said second major surface in two orthogonal directions.

19. The lid assembly as recited in claim 16 wherein said secondary throughways extend from an orifice in said second major surface towards said first major surface and said primary throughway extends from a bore-hole in said second major surface toward said first major surface, with said second major surface including an annular recess defining an annular, recessed base surface having an inner edge and an outer edge, and two spaced-apart side surfaces extending transversely from said inner edge and said outer edge of said annular base surface, respectively, to said second major surface, defining an annular opening therebetween, with the orifices of said secondary throughways being disposed in one of said side surfaces.

20. The lid assembly as recited in claim 19 wherein said annular base surface has a center axis disposed between the two spaced-apart side surfaces and extending radially symmetrically about said bore-hole, with both of the orifices associated with said secondary throughways being located within one of said side surfaces to allow a fluid stream to egress therefrom and travel tangentially to said center axis.

* * * * *